United States Patent [19]

Bush

[11] Patent Number: 4,782,326

[45] Date of Patent: Nov. 1, 1988

[54] ADPCM TRANSCODER DATA INTERFACE CIRCUIT HAVING AN ENCODED ENABLE SIGNAL

[75] Inventor: David E. Bush, Austin, Tex.

[73] Assignee: Motorola, Inc., Schaumburg, Ill.

[21] Appl. No.: 103,552

[22] Filed: Oct. 1, 1987

[51] Int. Cl.[4] .............................................. H03M 7/00
[52] U.S. Cl. ......................................... 341/76; 380/28
[58] Field of Search ................................... 340/347 DD

[56] References Cited

U.S. PATENT DOCUMENTS 4,079,371 3/1978 Shimamura ................. 340/347 DD

Primary Examiner—Charles D. Miller
Attorney, Agent, or Firm—John A. Fisher; Jeffrey Van Myers; Robert L. King

[57] ABSTRACT

A data interface circuit for use when interfacing between two communication links communicating frames of digital data in PCM and ADPCM formats is provided. The data interface circuit provides control information for selecting one of a plurality of algorithms to control the transformation of data between a plurality of PCM and ADPCM formats. A single encoded control signal is utilized to establish frame boundaries and to select a predetermined one of the plurality of algorithms to use in converting between PCM and ADPCM data.

8 Claims, 3 Drawing Sheets

ADPCM TRANSCODER DATA INTERFACE CIRCUIT HAVING AN ENCODED ENABLE SIGNAL

TECHNICAL FIELD

This invention relates generally to data communication circuits, and more particularly, to interface circuits for interfacing between the encoding and decoding of data in communication systems.

BACKGROUND ART

Bandwidth of voice frequency signals which exist in eight bit PCM format may be reduced by converting the eight bit PCM signal to a smaller bit ADPCM (adaptive differential pulse code modulation) signal. ADPCM signals may be transmitted over the same transmission lines as PCM signal with existing PCM equipment supplemented by ADPCM encoders and decoders for converting between PCM and ADPCM signals at the ends of the transmission links. The bit size of the ADPCM signal determines the frequency or bandwidth of transmission. I often desirable to modify the bandwidth to accomodate various transmission requirements. Typical ADPCM encoder/decoder circuits are controlled by algorithms which balance and control synchronous bandwidth with quality of voice information being communicated. As a result, a particular algorithm is required by ADPCM encoder/decoder circuits for each particular synchronous bandwidth. When changing between frequencies in ADPCM transmission, the proper algorithm for a frequency must be selected by the encoder/decoder circuit to operate. Previous encoder/decoder circuits have typically used distinct control signals to select the correct algorithm for a predetermined frequency of operation. Additional control signals require additional circuit inputs or I.C. pins to be included in the fabrication and packaging of the encoder/decoder circuit. An algorithm control signal is typically required at both an input terminal which receives eight bit PCM data to be encoded and at an input terminal which receives ADPCM data to be decoded. Therefore, additional packaging inputs are required for an encode/decode circuit.

BRIEF DESCRIPTION OF THE INVENTION

Accordingly, an object of the present invention is to provide an improved ADPCM data interface circuit having an encoded enable signal.

Another object of this invention is to provide an improved ADPCM data interface circuit which minimizes circuitry when selecting algorithmic modes of operation.

Yet another object of the present invention is to provide an improved method for selecting algorithms for use by an encode/decode circuit which interfaces between PCM and ADPCM communication channels.

In carrying out the above and other objects of the present invention, there is provided, in one form, a data interface circuit for interfacing digital data between first and second forms. The data has a first frequency when received and has a second frequency when transmitted. The second frequency has a value which is one of a plurality of predetermined frequency values. The data is encoded or decoded by the interface circuit between frequency values in accordance with one of a plurality of algorithms. A first portion of the interface circuit receives and stores the digital data and outputs the data in frame format at a predetermined clock rate. Frame boundaries of the digital data are controlled by a single control signal. A second portion of the interface circuit receives the data and provides an encoded algorithm signal in response to the same single control signal. The encoded algorithm signal controls which one of the plurality of algorithms that the data is encoded or decoded in accordance with. A third portion of the interface circuit receives and stores both the data in frame format and the encoded algorithm signal, for use when interfacing between the first and second frequencies.

These and other objects, features and advantages will be more clearly understood from the following detailed description taken in conjunction with the accompanying drawings.

DETAILED DESCRIPTION OF THE INVENTION

Figure 1:
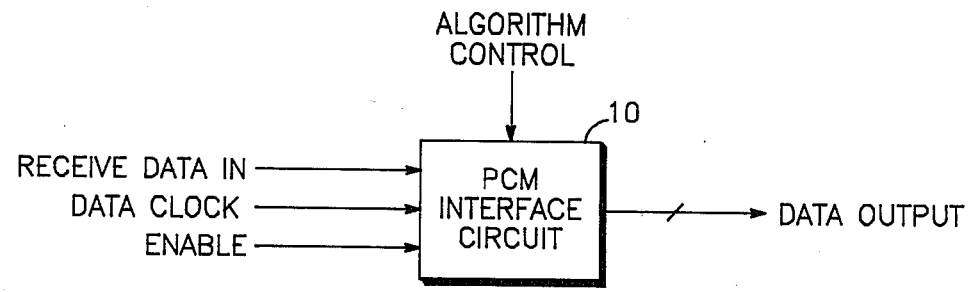
FIG. 1 illustrates in block diagram form an interface circuit known in the art.

Shown in FIG. 1 is a conventional block diagram of a pulse code modulation (PCM) interface circuit 10. Interface circuit 10 has a data input for serially receiving data, a data clock input for receiving a timing clock, an enable signal, and an algorithm control signal. A data output terminal of interface circuit 10 provides the encoded received data as output data in parallel form.

In operation, interface circuit 10 interfaces between two communication links by receiving eight bits of PCM data in an 8 kHz frame which is a 64 kbps PCM signal and outputting the data in parallel form. Eight successive bits B0 thru B7 of PCM data are serially clocked into the interface circuit 10 in response to the data clock which is an 8 kHz clock signal.

Figure 2:
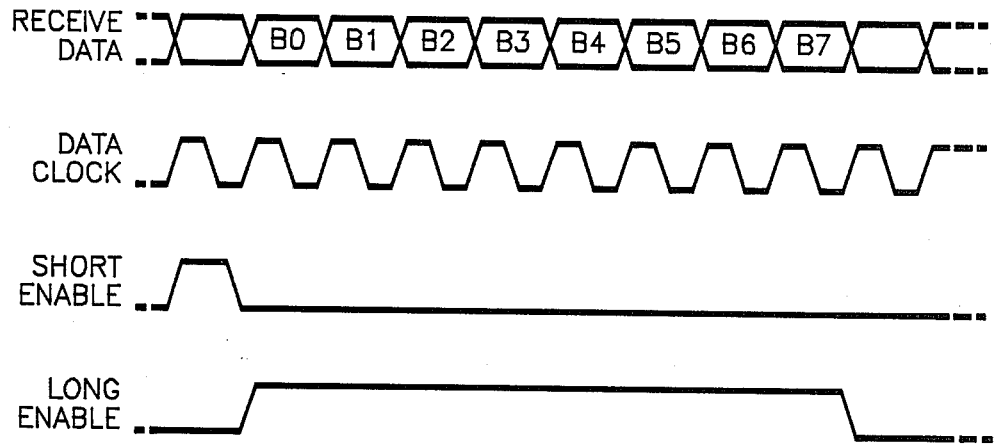
FIG. 2 illustrates in graphical form signals associated with the circuit of FIG. 1.

Subsequent circuitry provides an algorithm which controls the amount of signal compression which occurs on the 64 kbps PCM signal. An algorithm control signal is used by interface circuit 10 to correctly format the data for the algorithm used in subsequent circuitry. Typically, the PCM input signal is compressed to a 32 kbps, a 24 kbps, or a 16 kbps ADPCM signal. An individual algorithm is required for each output frequency. In order to properly frame format the data which is clocked into circuit 10, an enable signal is used. Referring to FIG. 2, the enable signal which controls circuit 10 is typically either a "short enable" signal or a "long enable" signal. The short enable signal provides a pulse during the bit immediately preceeding an eight bit frame. Therefore, every time an eight bit frame of data is received by interface circuit 10, a short enable signal pulse is received immediately before the frame boundary. An alternative enable signal format is commonly referred to as a long enable format wherein the long enable signal has a predetermined logic level during the entire frame. In the illustrated form of FIG. 2, the long enable signal defines an eight bit frame. If the algorithm is defined to compress eight bits of PCM data into four bits, the output data is 32 kbps ADPCM. Similarly, if the algorithm is defined to compress eight bits of PCM data into two bits, the output data is 16 kbps ADPCM. However, in order to change algorithms, the algorithm control signal coupled to interface circuit 10 implements the correct data format.

Figure 3:
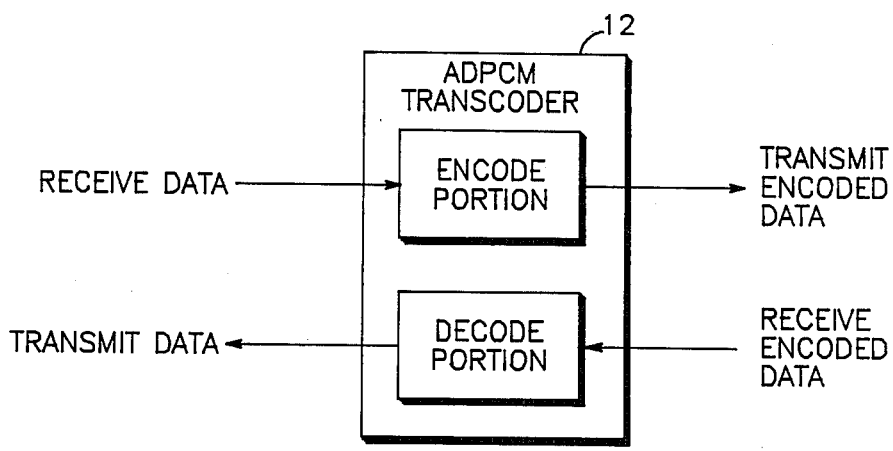
FIG. 3 illustrates in block diagram form data flow of an encode/decode circuit in accordance with the present invention.

Shown in FIG. 3 is a block diagram of the data flow of an ADPCM transcoder (encode/decode) 12 in accordance with the present invention. Transcoder 12 has an encode portion for receiving PCM data and outputting encoded ADPCM data, and has a decode portion for receiving encoded ADPCM data and outputting decoded PCM data. The encoding and decoding of data may occur simultaneously.

Figure 4:
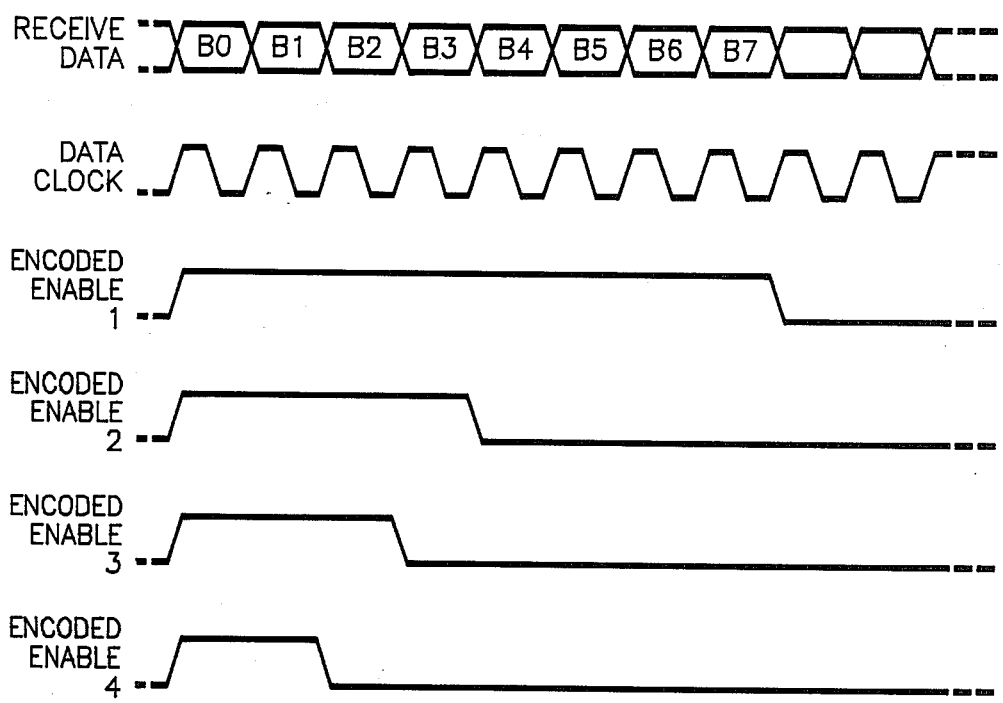
FIG. 4 illustrates in graphical form signals associated with the circuit of FIG. 3.
Figure 5:
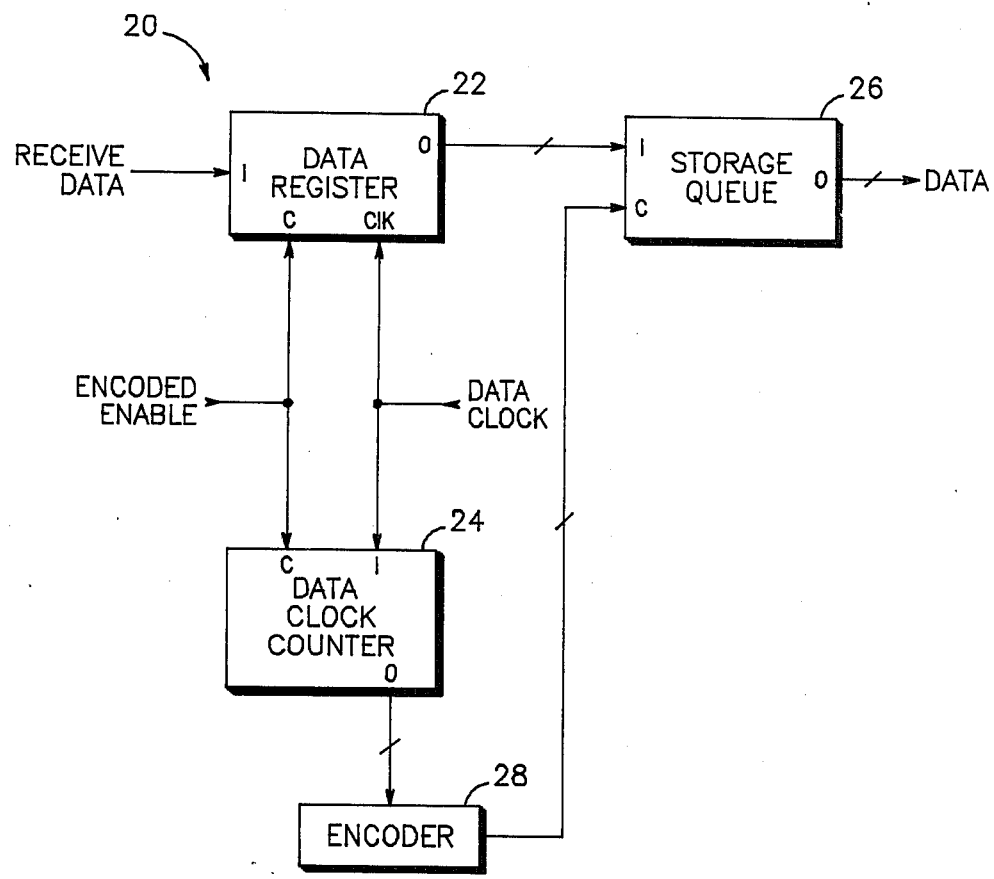

Shown in FIG. 4 is a graphical illustration of signals associated with transcoder 12, and shown in FIG. 5 is a detailed block diagram illustration of the encode portion of transcoder 12 which further illustrates the present invention. In FIG. 5, an encode portion 20 generally comprises a data register 22, a data clock counter 24, a storage queue 26, and an encoder 28. Data register 22 has an input terminal labeled "I" for receiving input data in PCM format and typically at 64 kbps. Data register 22 has a control terminal labeled "C" for receiving an encoded enable signal, and has a clock terminal labeled "Clk" for receiving a data clock. An output terminal of data register 22 labeled "O" is connected to an input terminal of storage queue 26 labeled "I". Data clock counter 24 has an input terminal labeled "I" for receiving the data clock, and has a control input labeled "C" for receiving the encoded enable signal. An output of data clock counter 24 labeled "O" is connected to an input of encoder 28. An output of encoder 28 is connected to a control data input labeled "C" of storage queue 26. An output of storage queue 26 labeled "O" provides a data output signal.

In operation, assume that the enable signal is an 8 kHz clock signal. The data which is received by data register 22 is a stream of digital data bits having either a logic high or logic low level as indicated by both levels being shown for each bit in FIG. 4. The input data is typically received at the rate of 64 kbps. The encoded enable signal couple to data register 22 and to data clock counter 24 makes data register 22 couple input data at a predetermined rate to queue 26 for storage. Simultaneously, data clock counter 24 counts the clock pulses of the data clock while the encoded enable signal is present in an active state. After the encoded enable signal has changed logic states, clock counter circuit 24 couples a count number to encoder 28. Encoder 28 uses the count number to correlate a predetermined count value to an operational state value. The operational state value is coupled to storage queue 26 along with the input data operand which has a predetermined bit length. The storage queue 26 provides the data operand along with the control information which selects the proper algorithm for further processing by circuitry (not shown) of transcoder 12. The data operand which is stored in queue 26 is subsequently outputted and transmitted as an encoded ADPCM data word after being formatted in accordance with the algorithm.

In the illustrated form, a single enable signal is utilized both for frame synchronization of the data being received by register 22 and for selection of a predetermined algorithm which is used by transcoder 12 to encode data from PCM format to ADPCM format. Data bits received by register 22 may either be logical "one" or "zero" values as indicated in the graph of FIG. 4. As shown in FIG. 4, the enable signal may be implemented in one of many different forms. For purposes of illustration only, four different enable signals are shown in FIG. 4. However, only one of the four illustrated enable signals is needed to implement the present invention. As in the case of the long enable signal of FIG. 2, the enable signal of the present invention functions to establish the beginning and termination of a frame of data. Further, the enable signal may be encoded by one of several ways, such as utilizing the duration or pulse width of the signal, to provide transcoder 12 control information concerning which algorithm to utilize in the interfacing function. Counter 24 provides an encoded count signal of the number of receive data bits counted in response to the width of the enable signal. For example, if the enable signal is present for eight bits as indicated by enable signal 1, the count value of eight may be encoded to indicate that the output of transcoder 12 is to be at 64 kbps and the proper algorithm subsequently selected to implement this frequency. If the enable signal is present for four bits as indicated by enable signal 2, the count value of four may be encoded to indicate that the output of transcoder 12 is to be at 32 kbps ADPCM and the proper algorithm selected to implement this frequency. Similarly, if the enable signal is present for even fewer bits as indicated by enable signals 3 and 4, the count values may be encoded to indicate that the output of transcoder 12 is to be at other ADPCM frequencies and the proper algorithm selected in response thereto to implement those predetermined frequencies. Encoder 28 functions to correlate a received count value with a predetermined state signal which is coupled to storage queue 26. Encoder 28 may be implemented by a conventional circuit to execute the encoding taught herein. Storage queue 26 contains the correct number of bits which were picked out of the stream of bits coupled to register 22 and contains the control information which allows transcoder 12 to modify the data of queue 26 using the proper algorithm.

In the illustrated form, the enable signal is encoded by utilizing the pulse width of the present signal. It should be apparent that other encoding mechanisms may be used such as encoding the enable signal according to signal level. A level detector circuit rather than counter 24 could be used to provide the input signal to encoder 28. Another use of the encoding of the enable signal is to encode the signal with information which places transcoder 12 in special modes of operation such as test modes. For example, if the enable signal remains in a logic high state for longer than the time required to receive eight data bits, the enable signal may be used to force transcoder 12 into a test mode.

Up to this point in the discussion the present invention has been directed toward the receipt of PCM data and the conversion of the data to ADPCM data as occurs in the encode portion of transcoder 12. The operation and use of the present invention applies analogously to the decode portion of transcoder 12 wherein the data received by data register 22 is ADPCM data and the algorithm which is encoded into the enable signal is an algorithm used by transcoder to change the data to PCM data. Therefore, another circuit in the decode portion of transcoder 12 which is similar in all respects to the encode portion 20, except for the format of data received and outputted, is provided in transcoder 12 so that transcoder 12 is able to simultaneously encode and decode data between PCM and ADPCM formats.

By now it should be apparent that a data interface circuit which uses a single control signal for frame synchronization and algorithm selection has been provided. By being able to select a required encoding or decoding algorithm at a correct frame rate with a single control signal, additional circuit inputs have been eliminated which minimizes integrated circuit packaging. Therefore, conventional three-wire PCM interface circuits commonly implemented in PCM coder/decoders (codecs) and filters and in other telephony integrated circuits may be vastly enhanced without adding the requirement for external control signals and packaging inputs. Therefore, the cost to manufacture data interface circuits incorporating the present invention is minimized.

While an embodiment has been disclosed using certain assumed parameters, it should be understood that certain obvious modifications to the circuit or the given parameters will become apparent to those skilled in the art, and the scope of the invention should be limited only by the scope of the claims appended hereto.

I claim:

1. A circuit for receiving digital data having a predetermined frequency and selectively outputting the data with control information, comprising:

first means for receiving and storing the digital data in response to a single enabling control signal, and for outputting the data in frame format at a predetermined clock rate substantially equal to the predetermined frequency and established by a data clock, the data having frame boundaries determined by the single enabling control signal;

second means for receiving both the data clock and enabling control signal and providing said control information by providing an encoded algorithm signal in response thereto, said encoded algorithm signal controlling which one of a plurality of predetermined algorithms said data may subsequently be encoded or decoded in accordance with; and third means coupled to both the first and second means for receiving, storing and outputting both the data in frame format and said encoded algorithm signal.

2. The circuit of claim 1 wherein a predetermined value for the encoded algorithm is provided in response to a number of bits of the data clock counted during an amount of time the single control signal's remains at a predetermined logic lever.

3. The circuit of claim 1 wherein the second means further comprises:

counter means having a first input for receiving the single control signal, a second input for receiving the clock signal, and an output for providing a count signal indicating a number of clock cycles of the clock signal when the single control signal is enabling; and encoding means having an input for receiving the count signal, and an output for providing the encoded algorithm signal in response to the count signal.

4. The circuit of claim 1 wherein the first and third means are respectively further characterized as being a data register and a storage queue.

5. The circuit of claim 1 wherein two of the plurality of predetermined algorithms function to encode or decode the data respectively as PCM data and ADPCM data.

6. A method for receiving digital data and adding control information thereto for subsequent use, the control information indicating which one of a plurality of predetermined algorithms the data may subsequently be encoded or decoded in accordance with, comprising the steps of:

receiving the digital data having a predetermined frequency and storing the data in a first storage means in response to a single enabling control signal;

couplting the data for storage in a second storage means in frame format in response to a data clock operating at a predetermined clock rate, the data having frame boundaries determined by the single enabling control signal, providing the control information in response to both the data clock and the enabling control signal; and outputting both the data and control information at the predetermined frequency.

7. A circuit for receiving data having a predetermined frequency and selectively outputting the data with control information, comprising:

a data register having a first input for receiving the digital data at a predetermined frequency, a control input for receiving a control signal, a clock input for receiving a data clock at a predetermined clock rate substantially equal to the predetermined frequency, and an output for providing the data in frame format, wherein frame boundaries of the data are controlled by the control signal;

a counter having a control input coupled to the same control signal, a data input for receiving the data clock, and an output for providing a count signal representing a count of the data clock in response to the control signal;

an encoder coupled to the counter and having an input for receiving the count signal, and having an output for providing an encoded algorithm signal as the control information, said encoded algorithm signal controlling which one of a plurality of predetermined algorithms the data may subsequently be encoded or decoded in accordance with; and a storage queue having a first input coupled to the output of the data register, a second input coupled to the output of the encoder, and an ouput for providing both the data at the predetermined frequency and the control information.

8. The circuit of claim 7 wherein two of the plurality of predetermined algorithms function to encode or decoder the data respectively as PCM data ADPCM data.

* * * * *